United States Patent
Li et al.

(10) Patent No.: US 11,011,420 B2
(45) Date of Patent: *May 18, 2021

(54) CONDUCTIVE INTERCONNECT STRUCTURES INCORPORATING NEGATIVE THERMAL EXPANSION MATERIALS AND ASSOCIATED SYSTEMS, DEVICES, AND METHODS

(71) Applicant: Micron Technology, Inc., Boise, ID (US)

(72) Inventors: Hongqi Li, Boise, ID (US); Anurag Jindal, Boise, ID (US); Jin Lu, Boise, ID (US); Shyam Ramalingam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/773,716

(22) Filed: Jan. 27, 2020

(65) Prior Publication Data

US 2020/0235007 A1 Jul. 23, 2020

Related U.S. Application Data

(60) Continuation of application No. 15/889,120, filed on Feb. 5, 2018, now Pat. No. 10,546,777, which is a
(Continued)

(51) Int. Cl.
*H01L 21/768* (2006.01)
*H01L 23/48* (2006.01)
(Continued)

(52) U.S. Cl.
CPC .... *H01L 21/76879* (2013.01); *H01L 21/2885* (2013.01); *H01L 21/76841* (2013.01);
(Continued)

(58) Field of Classification Search
CPC ......... H01L 23/481; H01L 2224/73265; H01L 2224/45015; H01L 21/486; H01L 21/1218
(Continued)

(56) References Cited

U.S. PATENT DOCUMENTS

| 7,417,315 B2 | 8/2008 | Hougham et al. |
| 9,099,442 B2 | 8/2015 | Jindal et al. |

(Continued)

FOREIGN PATENT DOCUMENTS

| CN | 1510742 A | 7/2004 |
| JP | 56150861 U | 11/1981 |

(Continued)

OTHER PUBLICATIONS

CN Patent Application No. 201480054281.7—Chinese Office Action and Search Report, dated Oct. 30, 2017, with English Translation, 20 pages.

(Continued)

*Primary Examiner* — David A Zarneke
(74) *Attorney, Agent, or Firm* — Perkins Coie LLP

(57) ABSTRACT

Semiconductor devices having interconnects incorporating negative expansion (NTE) materials are disclosed herein. In one embodiment a semiconductor device includes a substrate having an opening that extends at least partially through the substrate. A conductive material having a positive coefficient of thermal expansion (CTE) partially fills the opening. A negative thermal expansion (NTE) having a negative CTE also partially fills the opening. In one embodiment, the conductive material includes copper and the NTE material includes zirconium tungstate.

22 Claims, 8 Drawing Sheets

Related U.S. Application Data continuation of application No. 15/653,365, filed on Jul. 18, 2017, now Pat. No. 9,922,875, which is a continuation of application No. 14/815,560, filed on Jul. 31, 2015, now Pat. No. 9,754,825, which is a division of application No. 13/959,429, filed on Aug. 5, 2013, now Pat. No. 9,099,442.

(51) Int. Cl.
  H01L 21/288 (2006.01)
  H01L 21/48 (2006.01)

(52) U.S. Cl.
  CPC ...... *H01L 21/76898* (2013.01); *H01L 23/481* (2013.01); *H01L 21/486* (2013.01); *H01L 2224/45015* (2013.01); *H01L 2224/73265* (2013.01); *H01L 2924/0002* (2013.01)

(58) Field of Classification Search
  USPC ............... 257/734, 761, 762, 773, 774, 747; 438/629, 637, 639, 641, 675
  See application file for complete search history.

(56) References Cited

U.S. PATENT DOCUMENTS

| | | | |
|---|---|---|---|
| 9,754,825 B2 | 9/2017 | Li et al. | |
| 9,922,875 B2* | 3/2018 | Li | H01L 23/481 |
| 10,546,777 B2* | 1/2020 | Li | H01L 21/76841 |
| 2004/0251480 A1 | 12/2004 | Tolchinsky et al. | |
| 2005/0121768 A1 | 6/2005 | Edelstein et al. | |
| 2005/0151270 A1* | 7/2005 | Jones | H01L 23/49894 257/783 |
| 2006/0077519 A1 | 4/2006 | Floyd | |
| 2008/0048305 A1 | 2/2008 | Hougham et al. | |
| 2011/0204517 A1 | 8/2011 | Gu et al. | |
| 2011/0221044 A1 | 9/2011 | Danek et al. | |
| 2011/0284386 A1 | 11/2011 | Willey et al. | |
| 2012/0026074 A1 | 2/2012 | Lee et al. | |
| 2012/0086132 A1 | 4/2012 | Kim et al. | |
| 2012/0241917 A1 | 9/2012 | Ide et al. | |
| 2013/0320573 A1 | 12/2013 | Jindal et al. | |
| 2014/0117559 A1 | 5/2014 | Zimmerman et al. | |
| 2015/0035150 A1 | 2/2015 | Li et al. | |
| 2015/0187849 A1 | 7/2015 | Kachatryan et al. | |
| 2015/0340282 A1 | 11/2015 | Jindal et al. | |
| 2016/0276578 A1* | 9/2016 | Kobayashi | H01L 43/10 |
| 2017/0316974 A1 | 11/2017 | Jindal et al. | |
| 2019/0206778 A1* | 7/2019 | Lu | H01L 21/486 |
| 2019/0348344 A1* | 11/2019 | Lu | H01L 23/49579 |

FOREIGN PATENT DOCUMENTS

| | | |
|---|---|---|
| JP | 2004339018 A | 12/2004 |
| JP | 2005244031 A | 9/2005 |
| JP | 2006044953 A | 2/2006 |
| JP | 2007096233 A | 4/2007 |
| JP | 2012032753 A | 2/2012 |
| KR | 20120011591 A | 2/2012 |
| TW | 200626945 A | 8/2006 |
| TW | 201205801 A | 2/2012 |
| WO | 2013147856 A1 | 10/2013 |

OTHER PUBLICATIONS

International Search Report and Written Opinion dated Nov. 12, 2014 in PCT/US2014/048850, 13 pages.
KR Patent Application No. 10-2016-7005692—Korean Office Action, dated Oct. 30, 2017, with English Translation, 15 pages.
Office Action dated Sep. 25, 2015 in Taiwan Application No. 103126277, 13 pages.
TW Patent Application No. 103126277—Taiwanese Office Action, dated Jul. 28, 2017, with English Translation, 6 pages.
Andry, P.S. et al., A CMOS-Compatible Process for Fabricating Electrical Through-Vias in Silicon, IEEE 2006 Electronic Components and Technology Conference, pp. 831-837.
Extended European Search Report dated Feb. 10, 2017 in European Application No. 14834233.0, 9 pages.
Huang, R.J. et al. Negative thermal expansion and electrical properties of Mn3(Cu0.6NbxGe0.4-x)N (x=0.05-0.25) compounds. Materials Letters 62 (2008) 2381-2384.
Lind, C. "Two Decades of Negative Thermal Expansion Research: Where Do We Stand?" Materials 2012, 5, 1125-1154.
Lu, Kuan (Gary) et al. "Stress Analyses and Mechanical Reliability of 3D Interconnects with Through-Silicon Vias," University of Texas at Austin, Jun. 15, 2009, URL: https://www.ae.utexas.edu/~ruihuang/talks/TSV_June 2009.pdf.
Mary, T.A. et al. "Negative Thermal Expansion from 0.3 to 1050 Kelvin in ZrW2O8." Science 272.5258 (1996): 90-92.
Office Action dated Jan. 3, 2017 in Korean application No. 10-2016-7005692, 15 pages.
Office Action dated Mar. 14, 2017 in Japanese Application No. 2016-533328, 11 pages.
Singamaneni, S. et al. "Negative Thermal Expansion in Ultrathin Plasma." Chem. Mater. 19 (2007) pp. 129-131.
Sleight, A.W. "Negative Thermal Expansion." Mat. Res. Soc. Symp. Proc. vol. 755. DD10.6.1-DD10.6.11. 2003 Materials Research Society.
Sutton, M.S. et al. "Deposition dependence of zirconium tungstate (ZrW2O8) based negative thermal expansion films for optical coatings." Optical Interference Coatings (OIC) Tucson, Arizona, Jun. 27, 2004, Deposition of Optical Coatings III (ME7).
Tucker, M.G. et al. "Negative Thermal Expansion in ZrW2O8: Mechanisms, Rigid Unit Modes, and Neutron Total Scattering." Physical Review Letters. 95. 255501. Dec. 16, 2005.
Xiao, Z. et al. "Effect of post-deposition annealing on ZrW2O8 thin films prepared by radio frequency magnetron sputtering." Surface and Coatings Technology. 201 (2007) pp. 5560-5563.
Xu, C. et al. "Compact AC Modeling and Performance Analysis of Through-Silicon Vias in 3D ICs," IEEE Transactions on Electron Devices, vol. 57, No. 12, pp. 3405-3417, Dec. 2010.
International Search Report and Written Opinion dated Nov. 12, 2014 in International Application No. PCT/US2014/048850, 13 pages.

* cited by examiner

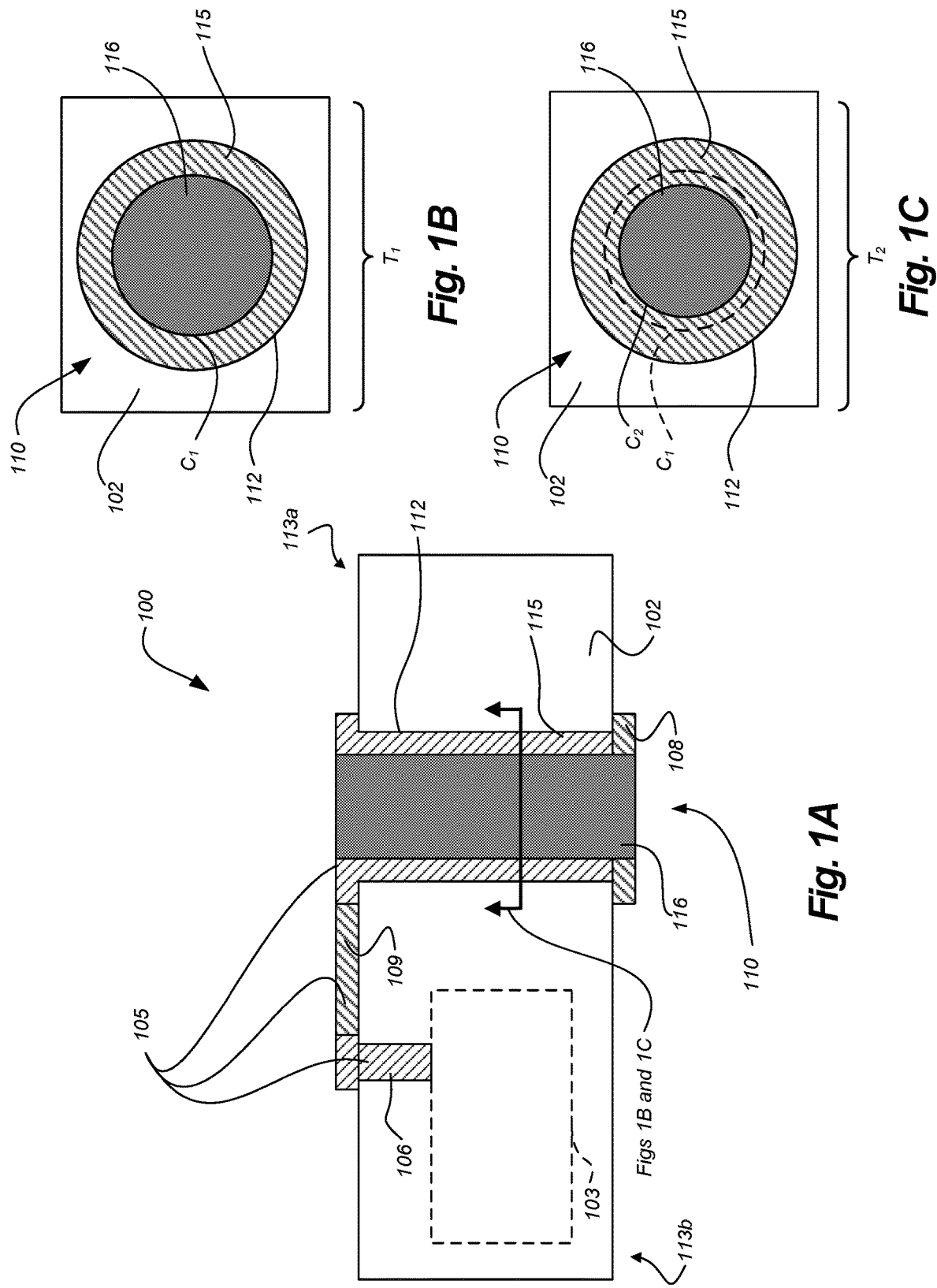

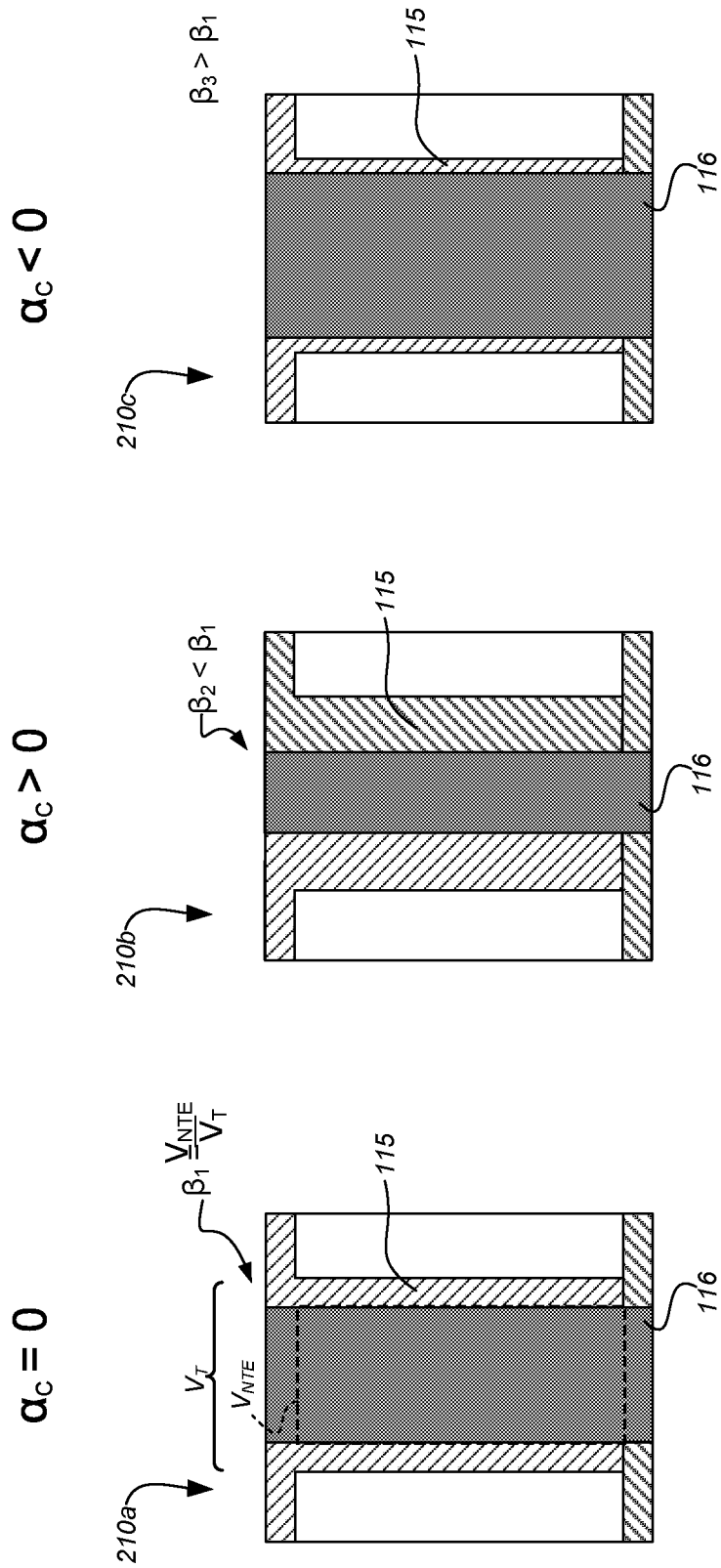

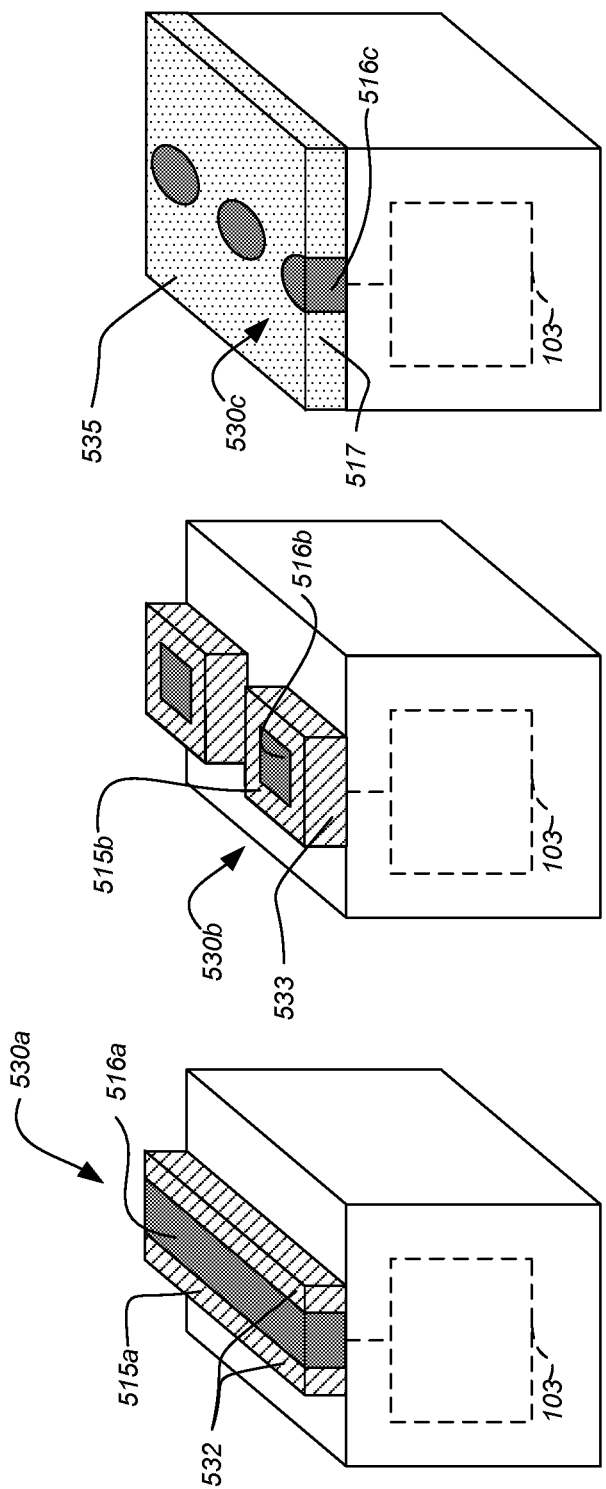

CONDUCTIVE INTERCONNECT STRUCTURES INCORPORATING NEGATIVE THERMAL EXPANSION MATERIALS AND ASSOCIATED SYSTEMS, DEVICES, AND METHODS

CROSS-REFERENCE TO RELATED APPLICATIONS

This application is a continuation of U.S. application Ser. No. 15/889,120, filed Feb. 5, 2018, now U.S. Pat. No. 10,546,777; which is a continuation of U.S. application Ser. No. 15/653,365, filed Jul. 18, 2017, now U.S. Pat. No. 9,922,875; which is a continuation of U.S. application Ser. No. 14/815,560, filed Jul. 31, 2015, now U.S. Pat. No. 9,754,825; which is a divisional of U.S. application Ser. No. 13/959,429, filed Aug. 5, 2013, now U.S. Pat. No. 9,099,442; each of which is incorporated herein by reference in its entirety.

TECHNICAL FIELD

The present technology is related to semiconductor device interconnects, such as vias, traces, and other contact structures that include materials that have a negative coefficient of thermal expansion (CTE).

BACKGROUND

Forming semiconductor devices typically includes subjecting a semiconductor substrate or assembly to a series of processing steps for adding, removing, and/or altering material. Cumulatively, these processing steps can precisely form very high densities of electrical components, e.g., transistors, capacitors, and diodes. The electrical components can be connected by complex network connections that typically extend over and through multiple layers. Such network connections from one layer to another layer can be vias formed by selectively etching holes through semiconductor materials in desired patterns and filling the holes with a conductive material. A through-silicon via (TSV) is one type of via that extends through the entirety of a semiconductor substrate. The TSV is isolated from the substrate by a dielectric spacer and electrically intercouples contacts or other conductive features at opposite sides of the substrate.

BRIEF DESCRIPTION OF THE DRAWINGS

FIG. 1A is a cross-sectional side view of a semiconductor device having a TSV configured in accordance with an embodiment of the present technology.

FIGS. 1B and 1C are cross-sectional top views of the TSV of FIG. 1A at an initial temperature level and at an elevated temperature level, respectively, in accordance with an embodiment of the present technology.

FIGS. 2A-2C are cross-sectional side views showing TSVs with different volumetric ratios of negative thermal expansion materials configured in accordance with selected embodiments of the present technology.

FIGS. 5A-5C are isometric views of interconnect structures configured in accordance with other embodiments of the present technology.

DETAILED DESCRIPTION

Figure 3A:
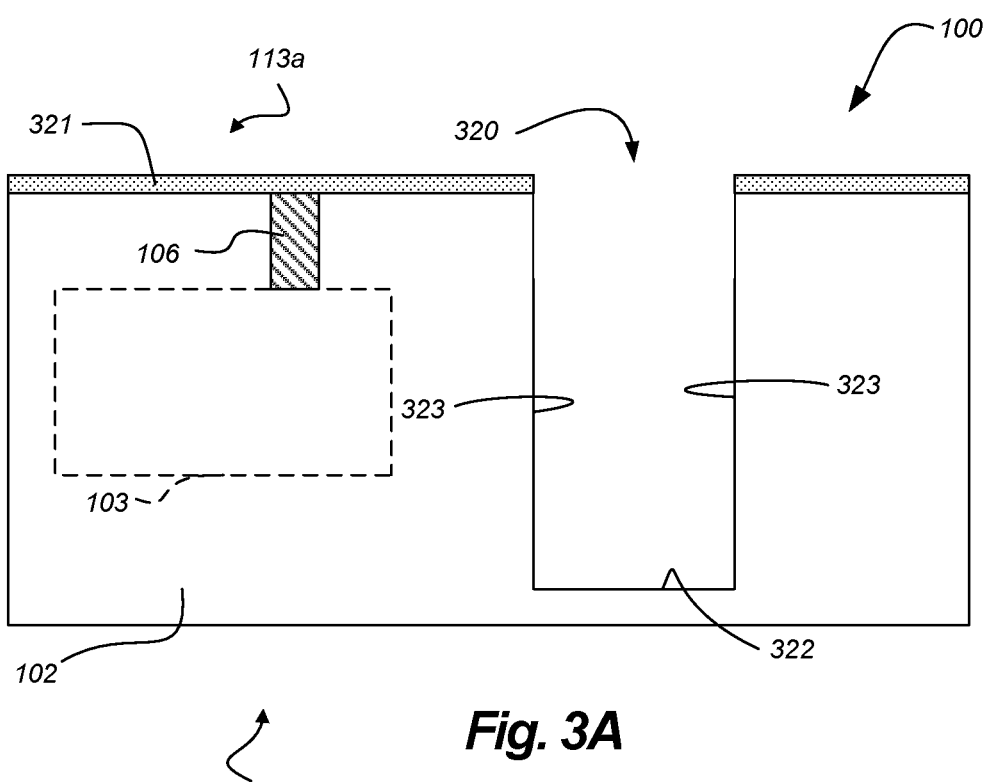
FIGS. 3A-3E are cross-sectional views illustrating the semiconductor device of FIG. 1A at selected steps in a method of manufacture in accordance with selected embodiments of the present technology.

Specific details of several embodiments of the present technology relate to electrodes in semiconductor devices incorporating negative thermal expansion (NTE) materials. The term "semiconductor device" generally refers to a solid-state device that includes semiconductor materials. Semiconductor devices can be logic devices, memory devices, and diodes, among others. Semiconductor devices can also include light emitting semiconductor devices, such as light emitting diodes (LEDs), laser diodes, and other solid state transducer devices. Further, the term "semiconductor device" can refer to a finished device or to an assembly or other structure at various stages of processing before becoming a finished device. The term "interconnect" can refer to any of a variety of conductive structures that extend vertically through and/or laterally across a portion of a semiconductor device or substrate. Examples of interconnects include vias, traces, contact pads, wires, and other conductive structures. Depending upon the context in which it is used, the term "substrate" can refer to a wafer-level substrate and/or to a singulated, die-level substrate. In addition, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization (CMP), or other suitable techniques. Also, materials can be patterned, for example, by adding and/or removing materials using one or more mask materials, such as photoresist materials, hard-mask materials, or other suitable materials.

One problem with conventional interconnect materials (e.g., metallic materials) is that they expand and contract more than many other materials in the substrate in response to temperature changes occurring in many of the manufacturing processes and operation. In general, interconnects expand in size based on their volume and coefficient of thermal expansion (CTE), and typically, the CTE of many interconnect materials is significantly larger than the CTE of materials in the substrate. For example, copper can have a CTE of about $1.7 \times 10^{-5}$ 1/K (linear), whereas silicon can have a CTE of about $2.3 \times 10^{-6}$ 1/K (linear). At elevated temperatures, this disparity in CTE causes the interconnects to expand to a greater extent than adjacent substrate materials. This expansion imposes a stress on the surrounding materials and leads to cracks in the substrate. These cracks can ultimately result in wafer breakage, device malfunction due to silicon lattice damage, device failure, and yield loss. Interconnects configured in accordance with several embodiments of the present technology, however, address these and other limitations of conventional interconnects.

FIG. 1A is a cross-sectional side view of a semiconductor device 100 configured in accordance with an embodiment of the present technology. The semiconductor device 100 includes a substrate 102 and an electrical component 103 (shown schematically). The substrate 102 can include, for example, a silicon substrate, an epitaxial structure, a stack of semiconductor materials, or other suitable structures. The electrical component 103 can be, for example, a transistor, a diode, an LED, a capacitor, an integrated circuit, etc.

The semiconductor device 100 further includes a network of conductive interconnects 105 configured to route electrical signals to internal components (e.g., the electrical component 103) and/or to external components (e.g., off-chip components). The interconnects 105 can include, for example, a via 106, a contact structure 108, and a trace 109 connecting the via 106 with the contact structure 108. In one aspect of the embodiment of FIG. 1A, the interconnects 105 also include a TSV 110 formed in a through hole 112 that extends through the substrate 102 between a first side 113a (e.g., a top or active side) and a second side 113b (e.g., a bottom or back side). As shown, the TSV 110 is isolated from the substrate 102 by a spacer material (not visible in FIG. 1A) and includes at least one outer conductive material 115 and at least one NTE material 116. The outer material includes a positive CTE material, such as aluminum, copper, silver, platinum, ruthenium, titanium, cobalt, etc. The NTE material 116, on the other hand, includes a negative CTE material. In one embodiment, the NTE material 116 can include a metal-oxide crystalline material. For example, zirconium tungstate ($Zr(WO_4)_2$) is one such material that has a negative CTE of approximately $-4.9 \times 10^{-6}$ 1/K. Unlike most crystalline materials, zirconium tungstate has "flexibly-hinged" lattice components ($ZrO_6$ and $WO_4$) that respond to increases in heat by reordering and/or rotating themselves into more compact configurations within the lattice. Other NTE materials can have lattice components that exhibit similar mechanisms of contraction when heated. For example, $ZrW_2O_8$ is a crystalline material that can have a negative CTE of approximately $-11.4 \times 10^{-6}$ 1/K.

As used herein, the term "NTE material" refers to a material that contracts in volume in response to an increase in temperature. Similar to a positive CTE material, an NTE material has a CTE associated with its magnitude of expansion/contraction over certain ranges temperature. However, unlike a positive CTE material, an NTE material has a negative CTE over certain temperature rages (e.g., $-50°$ C. to $250°$ C.). Other material properties, features, and compositions associated with NTE materials are described, for example, in T. A. Mary et al. "Negative Thermal Expansion from 0.3 to 1050 Kelvin in $ZrW_2O_8$." Science 272.5258 (1996): 90-92; D. Keen et al. "Negative thermal expansion in zirconium tungstate." *Phys. Rev. Lett.* 96 (2005); H. Liu et al. "Effect of post-deposition annealing on $ZrW_2O_8$ thin films prepared by radio frequency magnetron sputtering." *Surface and Coatings Technology.* 201.9-11 (2007):5560-5563; M. S. Sutton et al. "Deposition dependence of zirconium tungstate ($ZrW_2O_8$) based negative thermal expansion films for optical coatings." *Optical Interference Coatings (OIC)* Tucson, Ariz., Jun. 27, 2004, Deposition of Optical Coatings III (ME); S. Singamaneni et al. "Negative Thermal Expansion in Ultrathin Plasma." *Polymerized Film Chm. Mater.* 19 (2007): 129-131; Cora Lind. "Two Decades of Negative Thermal Expansion Research: Where Do We Stand?" *Materials* 2012, 5, 1125-1154; W. Sleight. "Negative Thermal Expansion." *Mat. Res. Soc. Symp. Proc.* Vol. 755 2003 Materials Research Society.

FIG. 1B is a cross-sectional top view of the TSV 110 at an initial temperature level $T_1$ (e.g., room temperature), and FIG. 1C shows the TSV 110 at an elevated temperature level $T_2$ (e.g., a manufacturing or operating temperature) in accordance with an embodiment of the present technology. At the initial temperature level $T_1$ (FIG. 1B), the conductive material 115 and the NTE material 116 interface with one another at a first circumference level $C_1$. At the elevated temperature level $T_2$ (FIG. 1C), the conductive material 115 has expanded and the NTE material 116 has contracted to expose an open space). As a result, a portion of the conductive material 115 can expand into the open space to relax the stress caused by thermal expansion.

Although not visible in FIG. 1C, the conductive material 115 can expand in the vertical direction (i.e., into the plane of the page) and the NTE material 116 can contract in the vertical direction between the first and second sides 113a and 113b (FIG. 1A). In general, the expansion/contraction in the vertical direction does not cause the typical (substrate) cracking, and the other types of damage associated with the conventional lateral expansion/contraction discussed above. In some embodiments, the expansion/contraction in the vertical direction can produce an open space at either ends of the TSV 100 (similar to the open space that be produced due to expansion/contraction in the lateral direction).

The change in volume of the NTE material 116 can be based, at least in part, on its negative CTE value, initial volume, and the change in temperature (i.e., $T_2-T_1$). In one embodiment, a change in the volume of the NTE material, $\Delta V_{NTE}$, can be approximated by Equation 1, as follows:

$$\Delta N_{NTE} = \alpha_1 \times V_{NTE}(T_2-T_1) \qquad (1)$$

where $\alpha_1$ represents the negative CTE of the NTE material 116 and $V_{NTE}$ represent the initial volume of the NTE material 116 at the initial temperature level $T_1$.

The change in the outer volume of the conductive material 115 is based, at least in part, on its positive CTE value, initial volume, and the change in temperature. In one embodiment, the change in the volume of the outer material, $\Delta Vo$, can be approximated by Equation 2, as follows:

$$\Delta Vo = \alpha_2 \times Vo(T_2-T_1) \qquad (2)$$

where $\alpha_2$ represents the positive CTE of the conductive material 115 and Vo represents the initial volume of the conductive material 115 at the initial temperature level $T_1$.

In accordance with various embodiments of the present technology, the TSV 110 can have a composite CTE that is based, at least in part, on the CTE of each material in the TSV 110 as well as the volume of each material in the TSV 110. In one embodiment, a composite CTE, $\alpha_c$, can be approximated by Equation 3, as follows:

$$\alpha_c = \beta \times \alpha_1 \times V_{NTE}(1-\beta) \times \alpha_2 \times Vo \qquad (3)$$

where $\beta$ is a volumetric ratio associated with the NTE material 116. The volumetric ratio $\beta$ can be approximated by Equation 4, as follows:

$$\beta = V_{NTE}/V_T \qquad (4)$$

where $V_T$ is the total volume of the TSV 110 (i.e., the aggregate of the volume of each material in the TSV 110).

In some embodiments, a composite CTE can be customized or engineered to have a particular value by selecting certain types of conductive materials and/or NTE materials. For example, when the conductive material 115 is composed of gold in lieu of copper, the composite CTE has a lesser value because gold has a lower CTE than copper. As described below, another way to configure the composite CTE is to change the volumetric ratio $\beta$ associated with the NTE material 116.

FIGS. 2A-2C are cross-sectional side views showing TSVs 210 (identified individually as first through third TSVs 210a-210c) with different volumetric ratios $\beta$ of the NTE material 116 in accordance with selected embodiments of the present technology. Referring first to FIG. 2A, a first volumetric ratio $\beta_1$ provides a composite CTE having a value of zero ($\alpha_c=0$). In FIG. 2B, a second volumetric ratio $\beta_2$ ($<\beta_1$) provides a composite CTE having a positive value ($\alpha_c>0$). In FIG. 2C, a third volumetric ratio $\beta_3$ ($>\beta_1$) provides a composite CTE having a negative value ($\alpha_c<0$).

Referring to FIGS. 2A-2C together, when heated, the first TSV 210a can expand or contract in proportion to its composite CTE. For example, when it has the first volumetric ratio $\beta_1$ (i.e., when $\alpha_c=0$), the first TSV 210a will not substantially expand or contract when heated. However, with the second volumetric ratio (32 (i.e., when $\alpha_c<0$), the second TSV 210b will generally expand when heated, albeit less than the expansion of a volume of the conductive material 115 alone. On the other hand, with the third volumetric ratio $\beta_3$ (i.e., when $\alpha_c<0$), the third TSV 210c contracts when heated. In some configurations, the third TSV 210c can contract at the same ratio at which another material expands. For example, the third TSV 210c can contract at the same ratio at which the adjacent substrate 102 expands.

Figure 3B:
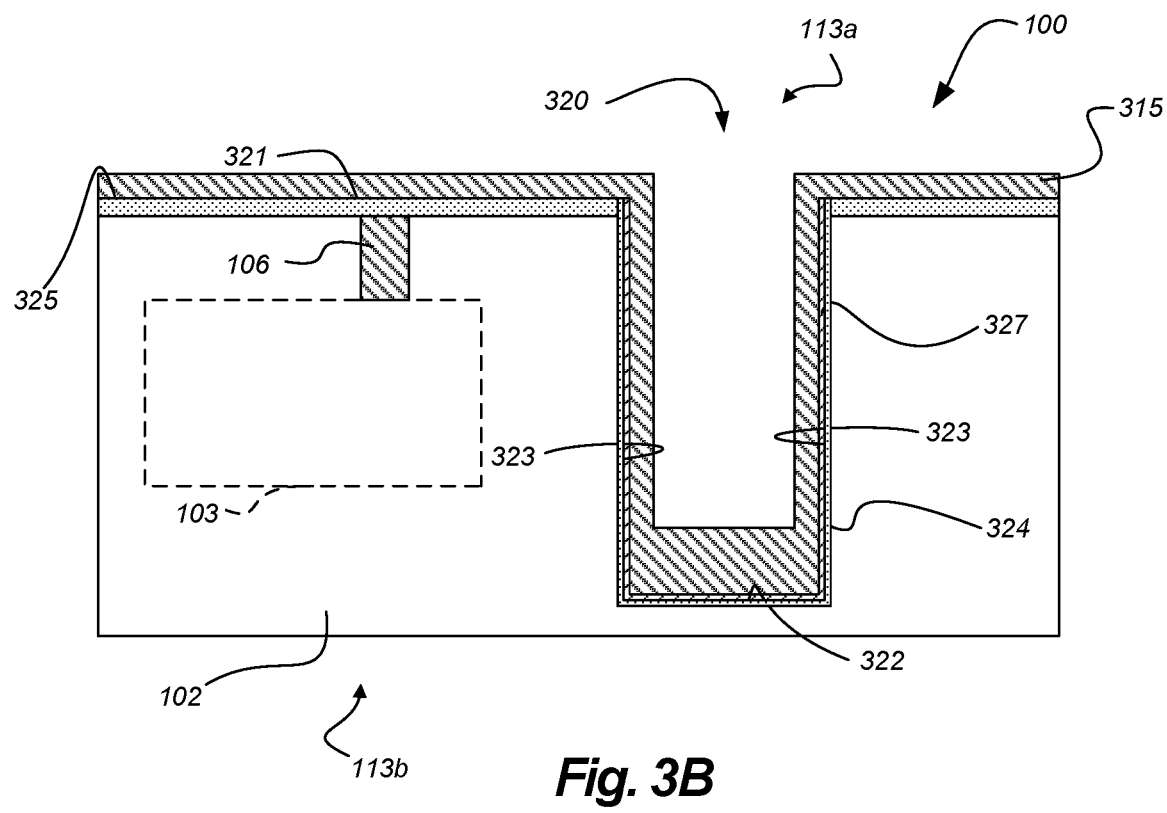

FIGS. 3A-3E are cross-sectional views illustrating the semiconductor device 100 at selected steps in a method of manufacture in accordance with selected embodiments of the present technology. As shown in FIG. 3A, a dielectric material 321 (e.g., oxide, silicon carbide, silicon nitride, etc.) has been formed on the substrate 102, and an opening 320 has been formed through the first side 113a of the substrate 102 and the dielectric material 321. In some embodiments, the dielectric material 321 can be employed as a stopping material in a CMP process during TSV isolation. The opening 320 includes a recessed surface 322 and sidewalls 323 extending to an intermediate depth within, but not completely through, the substrate 102. In the illustrated embodiment, the opening 320 has a circular (or ovular) shape (viewed from, e.g., the first side 113a of the semiconductor device 100). In other embodiments, however, the opening 320 can have a different configuration. For example, the opening 320 can be a trench. FIG. 3B shows the semiconductor device 100 after a dielectric liner 324 (e.g., an oxide liner) and a conductive material 315 have been formed, respectively, in the opening 320. In the illustrated embodiment, the conductive material 315 toward the bottom of the opening 320 is thicker than the conductive material toward the sidewalls in the opening 320. In one embodiment, a bottom-up plating process can be used to form relatively thicker metal (e.g., copper) at the bottom of the opening followed by more uniform plating along the sidewalls once the thicker metal has been formed. The conductive material 315 can include, for example, copper, tungsten, gold, silver, platinum, aluminum, etc. In some embodiments, the conductive material 315 is an electroplated material that lines the recessed surface 322, the sidewalls 323, and an outer surface 325 of the substrate 102. The semiconductor device 100 can also include a barrier and/or seed materials 327 between the conductive material 315 and portions of the substrate 102. The barrier and/or seed materials 327 can include, for example, tantalum, tantalum nitride, tungsten, ruthenium, copper, titanium, titanium nitride, or other suitable materials.

Figure 3C:
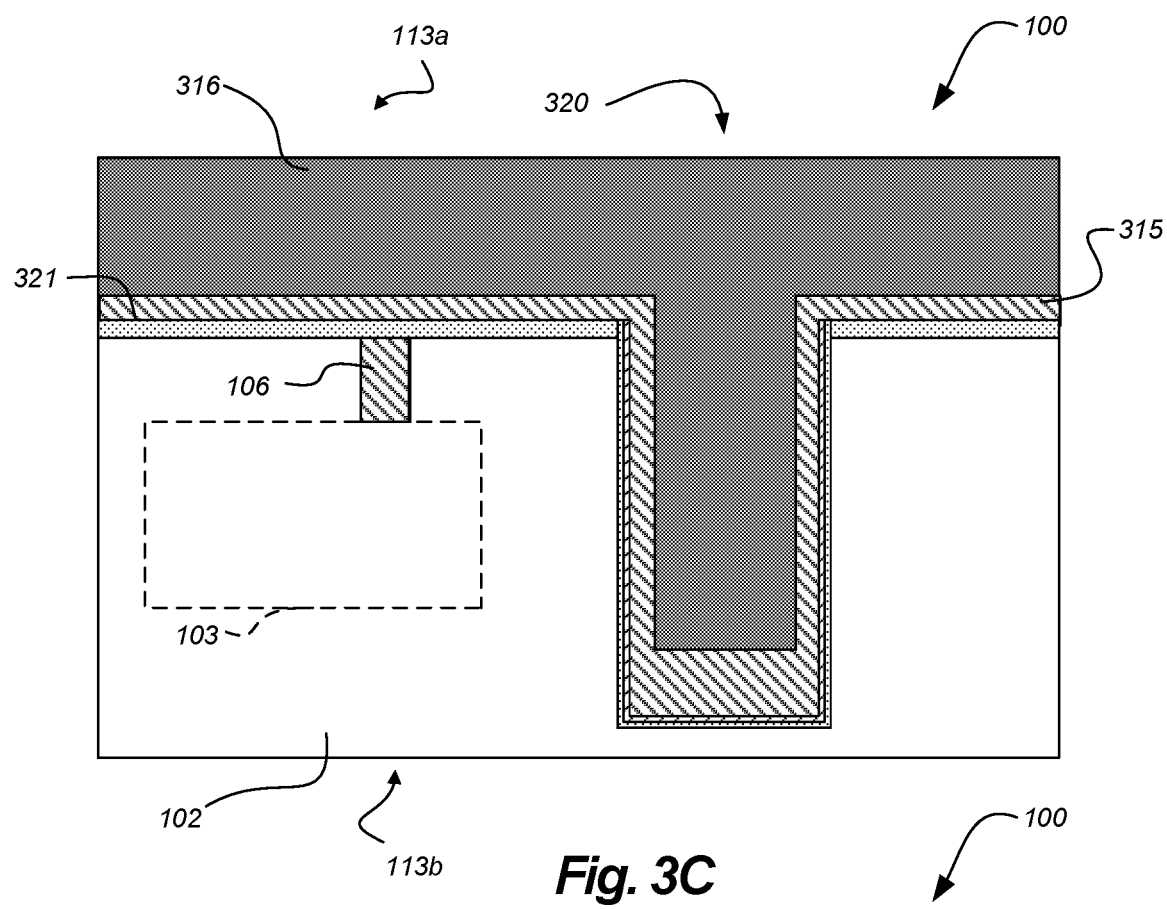

FIG. 3C shows the semiconductor device 100 after an NTE material 316 has been deposited on the conductive material 315. The NTE material 316 can be deposited, for example, using chemical vapor deposition or other suitable techniques. As discussed above, the NTE material 316 can include a metal oxide such as zirconium tungstate. Another suitable NTE material can include $ZrV_2O_7$. In other embodiments, suitable NTE materials can include members of the 'A' '$M'_2O_8$ family of compounds and/or the '$A'_2$('$M'O_4$)$_3$ family of compounds, where 'A' can include zirconium or hafnium and 'B' can include molybdenum or tungsten.

Figure 3D:
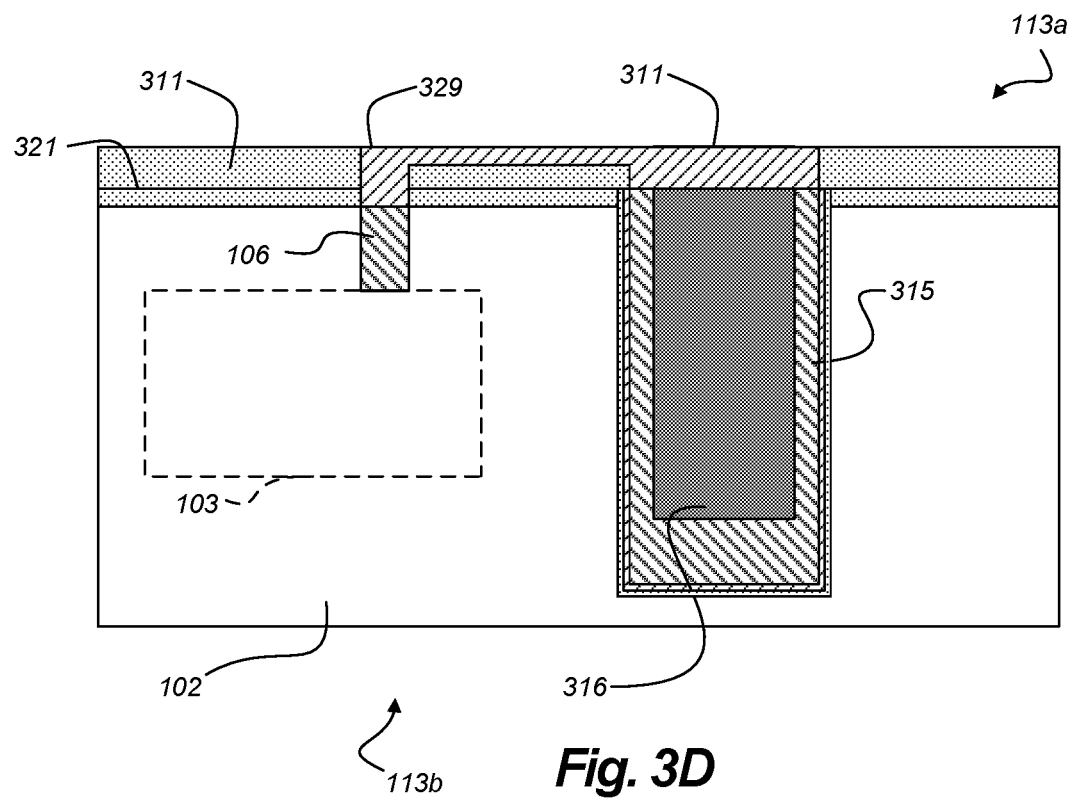

FIG. 3D shows the semiconductor device 100 after forming other device features. In the illustrated embodiment, an additional conductive material 329 forms an interconnect structure that connects the conductive material 315 with the contact 106. As shown, an additional dielectric material 311 has been formed on the dielectric material 321 and the NTE material 316, a portion of the dielectric material has been removed (e.g., etched) to form openings in the dielectric materials 311, 321, and the openings formed in the dielectric materials 311, 321 have been filled with portions of the conductive material 329. In some embodiments, the conductive material 329 can be deposited on at least a portion of the NTE material 316 at the first side 113a.

Figure 3E:
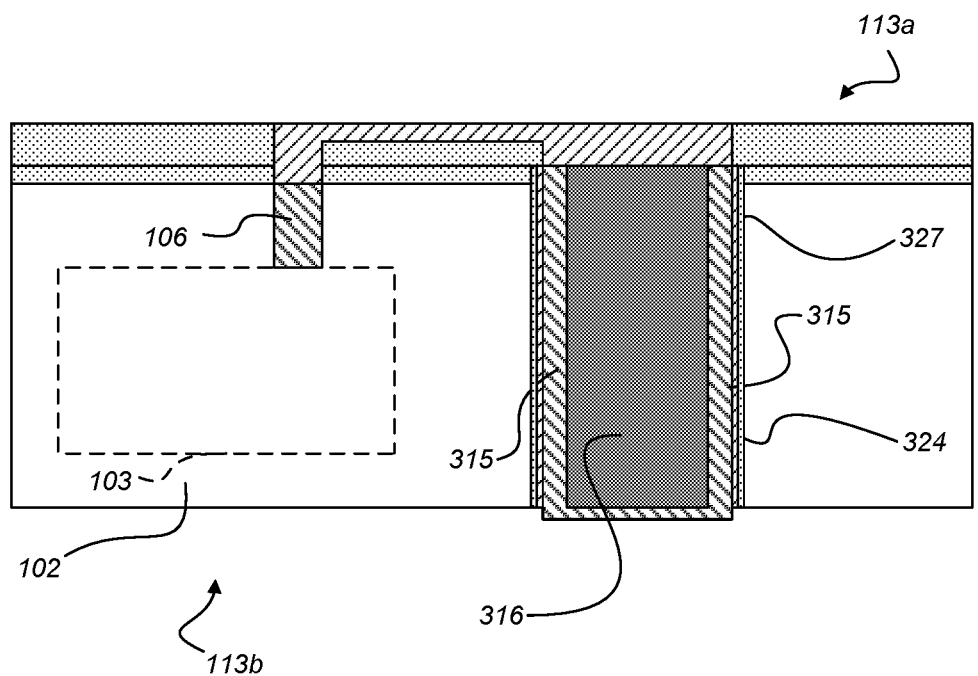

FIG. 3E shows the semiconductor device 100 after removing portions of the conductive material 315 and the substrate 102 to expose portions of the conductive material 315 at the second side 113b. Material can be removed by, for example, backgrinding, etching, CMP and/or other suitable removal methods. Also, various passivation materials (not shown in FIG. 3E) can be employed at the second side 113b to protect the substrate 102 and prevent contamination (e.g., metallic contamination). In one embodiment, a thinning process may use exposure of the dielectric material of the liner 324 at the second side 113b (to detect when the removal process should be stopped, such as an endpoint detection, to enhance process control in subsequent processing. In another embodiment, conductive materials (e.g., the conductive material 315 and/or the barrier seed materials 327) can provide endpoint detection. After exposing portions of the conductive material 315, processing can continue, for example, to form other features (e.g., the contact structure 108 (FIG. 1A) as well as to device singulation, testing, and/or packaging.

Figure 4A:
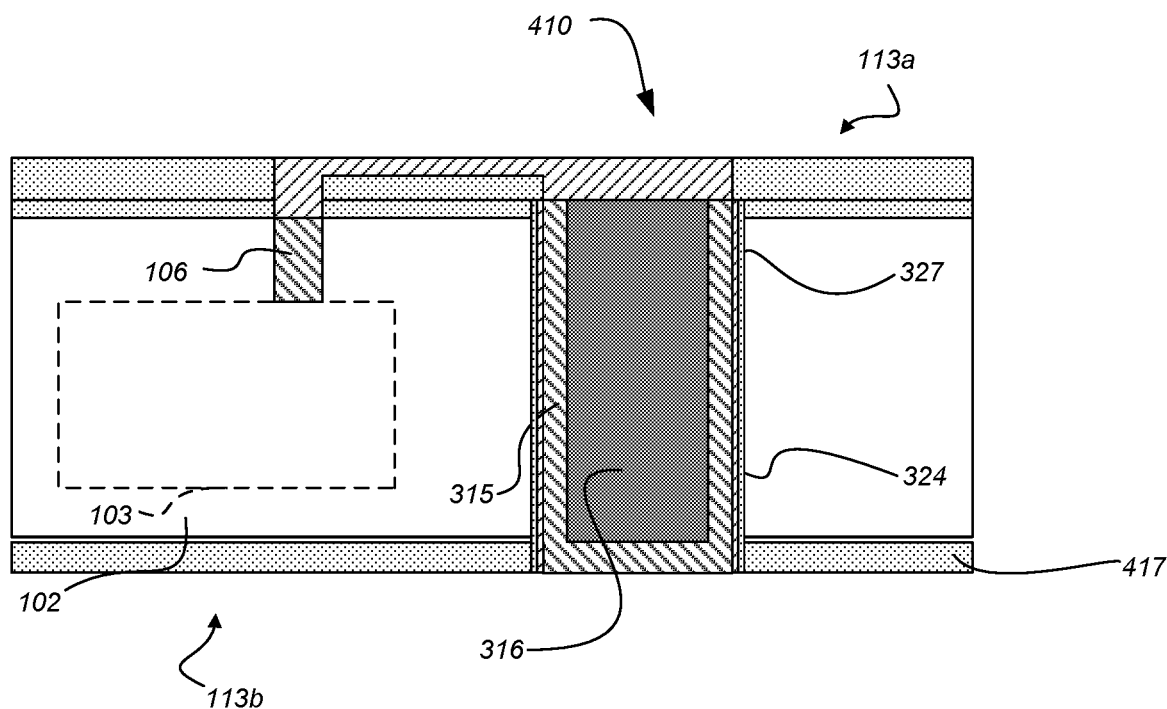
FIGS. 4A and 4B are cross-sectional side views of a semiconductor device having a TSV configured in accordance with another embodiment of the present technology.

FIG. 4A shows a TSV 410 including the conductive material 315 and the NTE material 316 (e.g., after the stage of FIG. 3D) after the substrate 102 has been thinned to expose the dielectric liner 324 at the second side 113b such that portions of the dielectric liner 324 and the conductive material 315 project beyond the substrate material at the second side 113b. A dielectric material 417 is then formed at the second side 113b. The dielectric material 417 can be a conformal or non-conformal material, including a low-temperature dielectric that initially covers the TSV 410 at the second side 113b. A subsequent material removal process (having a higher controllability) can expose the conductive material 315 (or, alternatively, the conductive material 315 along with a portion of the NTE material 316) by removing portions of the thick dielectric material 417 and the dielectric liner 324.

Figure 4B:
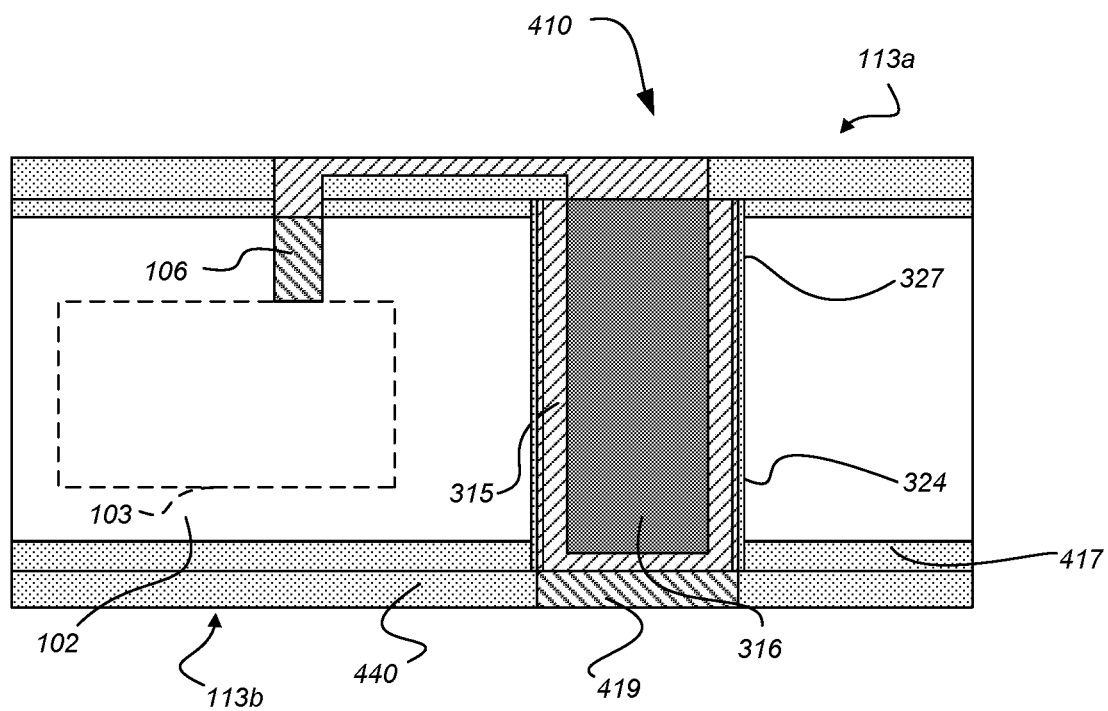

FIG. 4B shows a thick dielectric material 440 (e.g., low temperature oxide, nitride, carbide, etc.) that is deposited on the dielectric material 417 and the exposed conductive material 315 of FIG. 4A. In the illustrated embodiment, an additional conductive material 419 can form an electrical contact. For example, the thick dielectric material 440 and the conductive material 419 can form a damascene structure.

FIGS. 5A-5C are isometric views of interconnect structures configured in accordance with other embodiments of the present technology. Similar to the TSVs discussed above, the interconnect structures of FIGS. 5A-5C can be configured to incorporate NTE materials. FIG. 5A is an example that shows a conductive trace 530a that includes an outer conductive material 515a arranged in parallel lines 532 and an inner NTE material 516a between the parallel lines 532. FIG. 5B shows an example of a contact pad 530*b* having an outer conductive material 515*b* arranged in a square pattern 533 and an inner NTE material 516*b* in the center of the square 533. Figure K is an example of an interlevel dielectric 535 having an outer dielectric material 517 (e.g., an oxide) and an inner NTE material 516*c* configured as a via 530*c*. Unlike the TSVs discussed above, the via 530*c* does not include an outer conductive material. In one embodiment, the NTE material 516*c* is configured such that at elevated temperatures the NTE material 516*c* contracts at the same ratio at which the outer dielectric material 517 expands (and vice versa).

Figure 6:
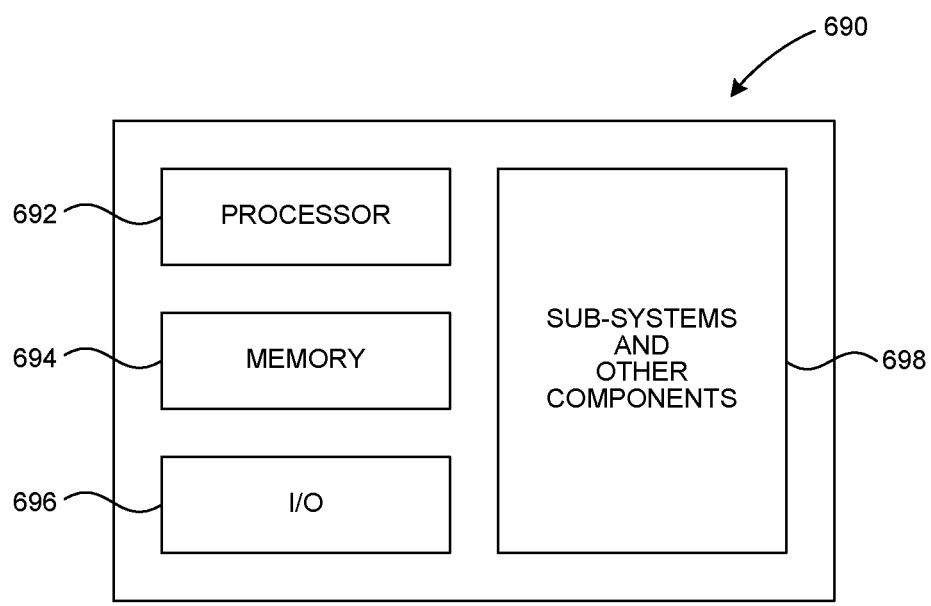
FIG. 6 is a block diagram illustrating a system that incorporates a semiconductor device in accordance with an embodiment of the present technology.

Any one of the semiconductor devices having the features described above with reference to FIGS. 1A-5 can be incorporated into any of a myriad of larger and/or more complex systems, a representative example of which is system 690 shown schematically in FIG. 6. The system 690 can include a processor 692, a memory 694 (e.g., SRAM, DRAM, flash, and/or other memory devices), input/output devices 696, and/or other subsystems or components 698. The semiconductor assemblies, devices, and device packages described above with reference to FIGS. 1A-5C can be included in any of the elements shown in FIG. 6. The resulting system 690 can be configured to perform any of a wide variety of suitable computing, processing, storage, sensing, imaging, and/or other functions. Accordingly, representative examples of the system 690 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 690 include lights, cameras, vehicles, etc. With regard to these and other examples, the system 690 can be housed in a single unit or distributed over multiple interconnected units, e.g., through a communication network. The components of the system 690 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In various embodiments, the above-described interconnects can vary in shape, size, number, and other characteristics. For example, the NTE material 116 (FIG. 1) can be formed such that a gap or void is incorporated (or naturally occurs) within the center of the TSV 100 (FIG. 1). Also, in some embodiments, the NTE 116 material can be deposited such that it covers or encapsulates the conductive material 115 (FIG. 1). For example, in some embodiments, the conductive material 115 can form the interior portion of the TSV 100 and the NTE material 116 can be employed as a capping material. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A semiconductor device, comprising:
   a substrate;
   a conductive structure disposed over the substrate, the conductive structure including:
      an inner material having a negative coefficient of thermal expansion (CTE), and
      an outer material disposed adjacent to and laterally outward from the inner material, the outer material having a positive CTE.

2. The semiconductor device of claim 1, wherein the conductive structure is a trace.

3. The semiconductor device of claim 2, wherein the inner material is a conductive material arranged in a line, and wherein the outer material is disposed adjacent to and laterally outward from the line.

4. The semiconductor device of claim 2, wherein the outer material is a conductive material arranged in parallel lines, and wherein the inner material is disposed between and laterally inward from the parallel lines.

5. The semiconductor device of claim 1, wherein the outer material is disposed on opposing lateral sides of the inner material.

6. The semiconductor device of claim 1, wherein the conductive structure is an interconnect structure.

7. The semiconductor device of claim 6, wherein the interconnect structure is a contact pad.

8. The semiconductor device of claim 1 wherein the inner material includes $Zr(WO_4)_2$, $ZrV_2O$, $ZrMo_2O_8$, $ZrW_2O_8$, $HfMo_2O_8$, or $HfW_2O_8$, $Zr_2(MoO_4)_3$, $Zr_2(WO_4)_3$, $Hf_2(MoO_4)_3$, $Hf_2(WO_4)_3$, or a combination thereof.

9. The semiconductor device of claim 1 wherein the conductive structure is configured so that at a first temperature, the inner material contracts at a same ratio at which the outer material expands.

10. The semiconductor device of claim 1 wherein the conductive structure is configured so that at a second temperature, the inner material expands at a same ratio at which the outer material contracts.

11. The semiconductor device of claim 1 wherein the inner and outer materials together have a composite CTE that is less than the positive CTE, but greater than the negative CTE.

12. The semiconductor device of claim 11 wherein the composite CTE is less than zero.

13. The semiconductor device of claim 11 wherein the composite CTE is equal to about zero.

14. A method of manufacturing a semiconductor device, comprising:
    disposing an inner material over a substrate, wherein the inner material has a negative coefficient of thermal expansion (CTE); and
    disposing an outer material over the substrate, adjacent to and laterally outward from the inner material, wherein the outer material has a positive CTE.

15. The method of claim 14 wherein the outer material is disposed on opposing sides of the inner material.

16. The method of claim 14 wherein the outer material is a conductive material arranged in parallel lines, and wherein the inner material is between and laterally inward from the parallel lines.

17. The method of claim 14 wherein the inner material includes $Zr(WO_4)_2$, $ZrV_2O$, $ZrMo_2O_8$, $ZrW_2O_8$, $HfMo_2O_8$, or $HfW_2O_8$, $Zr_2(MoO_4)_3$, $Zr_2(WO_4)_3$, $Hf_2(MoO_4)_3$, $Hf_2(WO_4)_3$, or a combination thereof.

18. The method of claim 14 wherein at a first temperature, the inner material contracts at a same ratio at which the outer material expands.

19. The method of claim 14 wherein at a second temperature, the inner material expands at a same ratio at which the outer material contracts.

20. The method of claim 14 wherein the inner and outer materials together have a composite CTE that is less than the positive CTE, but greater than the negative CTE.

21. The method of claim 20 wherein the composite CTE is less than zero.

22. The method of claim 20 wherein the composite CTE is equal to about zero.

* * * * *